(12) United States Patent
Suzuki

(10) Patent No.: US 10,855,268 B2
(45) Date of Patent: Dec. 1, 2020

(54) DRIVER CIRCUIT FOR SWITCH

(71) Applicant: DENSO CORPORATION, Kariya, Aichi-pref. (JP)

(72) Inventor: Tomotaka Suzuki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/596,837

(22) Filed: Oct. 9, 2019

(65) Prior Publication Data

US 2020/0112303 A1   Apr. 9, 2020

(30) Foreign Application Priority Data

Oct. 9, 2018   (JP) .................. 2018-191254

(51) Int. Cl.
| | |
|---|---|
| *H03K 3/00* | (2006.01) |
| *H03K 17/042* | (2006.01) |
| *H02M 1/08* | (2006.01) |
| *H02M 1/00* | (2006.01) |
| *H02P 27/06* | (2006.01) |
| *H02M 7/5387* | (2007.01) |

(52) U.S. Cl.
CPC ............ *H03K 17/042* (2013.01); *H02M 1/08* (2013.01); *H02M 7/53871* (2013.01); *H02M 2001/0054* (2013.01); *H02P 27/06* (2013.01)

(58) Field of Classification Search
CPC .. H03K 17/042; H02M 1/08; H02M 7/53871; H02M 2001/0054; H02P 27/06
USPC ......................................................... 327/109
See application file for complete search history.

(56) References Cited

U.S. PATENT DOCUMENTS

| | | | | |
|---|---|---|---|---|
| 9,692,405 | B2 * | 6/2017 | Na .................... | H03K 17/06 |
| 9,991,881 | B2 * | 6/2018 | Na .................... | H03K 17/168 |
| 10,110,217 | B2 * | 10/2018 | Senda ............... | H02M 1/088 |
| 2004/0125627 | A1 * | 7/2004 | Nadd ................. | H02M 1/08 |
| | | | | 363/125 |
| 2012/0280728 | A1 * | 11/2012 | Hussein ............ | H03K 17/127 |
| | | | | 327/155 |
| 2013/0062626 | A1 * | 3/2013 | Takao ............... | H03K 17/127 |
| | | | | 257/77 |
| 2016/0233858 | A1 | 8/2016 | Wasekura et al. | |
| 2020/0112308 | A1 | 4/2020 | Suzuki et al. | |

* cited by examiner

*Primary Examiner* — Ryan Jager
(74) *Attorney, Agent, or Firm* — Oliff PLC

(57) ABSTRACT

A driver circuit works to drive a first switch and a second switch connected in parallel to each other. The driver circuit includes first and second charge switches and first and second diodes to turn on only one(s) of the first and second switches selected as an on-target(s). The driver circuit includes first and second individual discharging paths connected to gates of the first and second switches, first and second discharge resistors, a shared discharge path, and a shared discharge resistor. This structure is capable of reducing a switching loss.

11 Claims, 14 Drawing Sheets

$Vse \leq V\alpha$
FIG.3(a) Sg
FIG.3(b) SW61A
FIG.3(c) SW61B
FIG.3(d) SW73
FIG.3(e) SW74A
FIG.3(f) SW74B
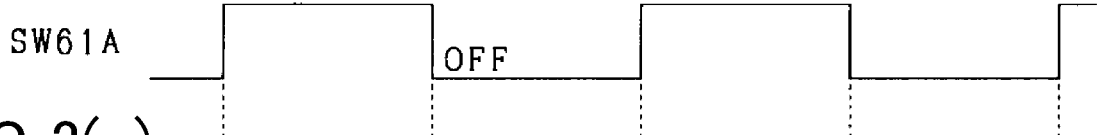
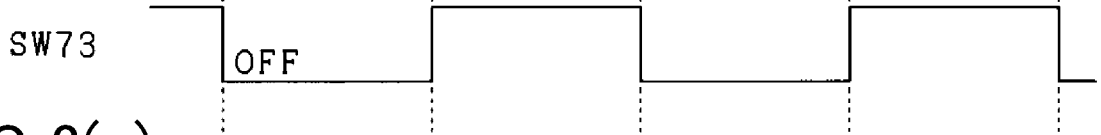
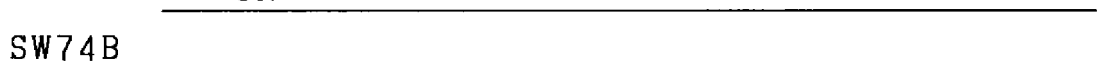
Time Vse>Vα
FIG.4(a) Sg
FIG.4(b) SW61A
FIG.4(c) SW61B
FIG.4(d) SW73
FIG.4(e) SW74A
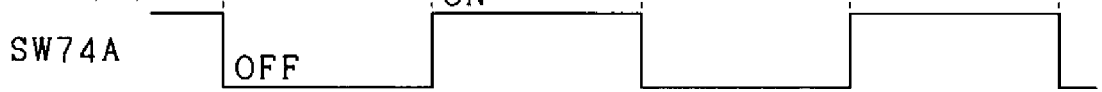
FIG.4(f) SW74B
Time Vse>Vα
FIG.5(a) Sg
FIG.5(b) SW61A
FIG.5(c) SW61B
FIG.5(d) SW73
FIG.5(e) SW74A
FIG.5(f) SW74B
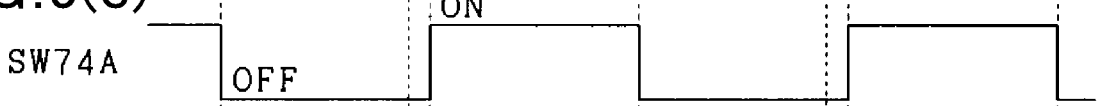
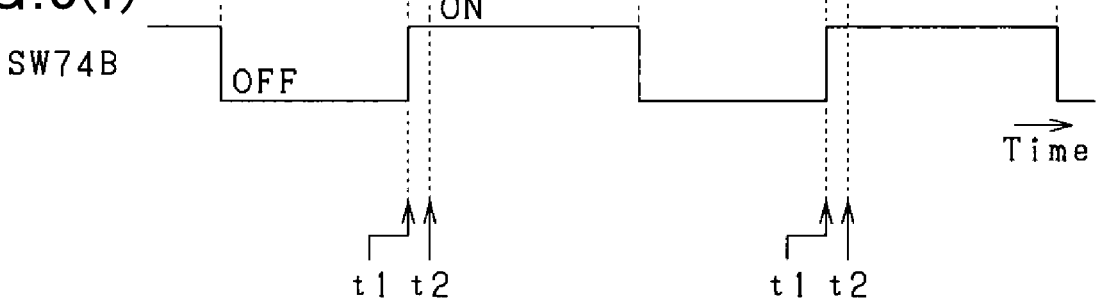

$\begin{pmatrix} \cdot Rd1 = Roff + Rb \\ \cdot Rd2 = 2Roff + Rb \end{pmatrix}$ $Vse \leq V\alpha$
FIG.13(a) Sg
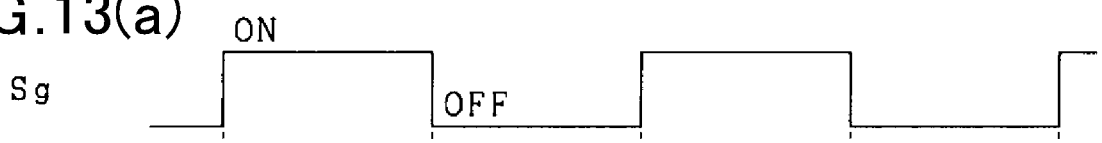
FIG.13(b) SW101A
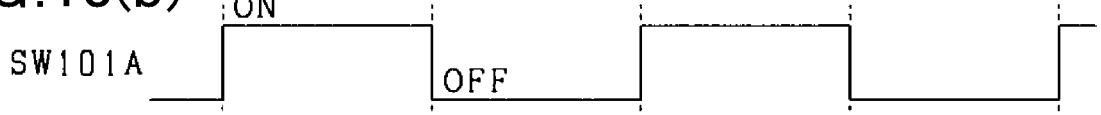
FIG.13(c) SW101B
FIG.13(d) SW73
FIG.13(e) SW74A
FIG.13(f) SW74B
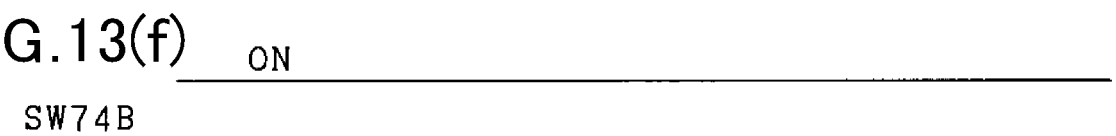
Time Vse>Vα
FIG.14(a) Sg
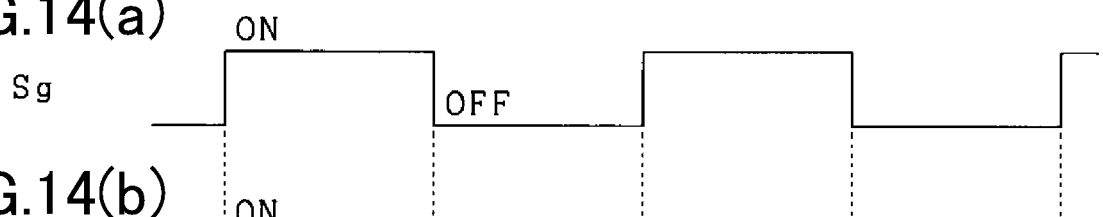
FIG.14(b) SW101A
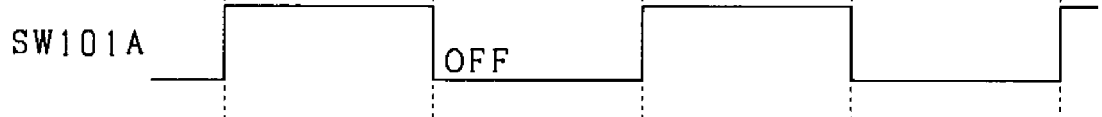
FIG.14(c) SW101B
FIG.14(d) SW73
FIG.14(e) SW74A
FIG.14(f) SW74B
Time $$\begin{pmatrix} \cdot Rc1 = Ron + Ra \\ \cdot Rc2 = 2Ron + Ra \end{pmatrix}$$

DRIVER CIRCUIT FOR SWITCH

CROSS REFERENCE TO RELATED DOCUMENT

The present application claims the benefit of priority of Japanese Patent Application No. 2018-191254 filed on Oct. 9, 2018, the disclosure of which is incorporated herein by reference.

BACKGROUND

1 Technical Field

This disclosure relates generally to a driver circuit for switches.

2 Background Art

A driver circuit is known which works to actuate a first switch and a second switch connected in parallel to each other. The driver circuit selects and turns on or off one of the first and second switches.

The driver circuit faces a drawback in that when either one of the first and second switches is turned on, it may result in insufficient decrease in switching loss.

SUMMARY

It is an object of this disclosure to provide a driver circuit for switches capable of decreasing a switching loss.

According to one aspect of this disclosure, there is provided a driver circuit for driving a plurality of switches connected in parallel to each other. The driver circuit comprises: (a) a switch unit which works to turn on only selected one(s) of the switches; (b) individual electrical paths each of which is connected at a first end to a gate of one of the switches; (c) individual resistors each of which is arranged in one of the individual electrical paths; (d) a shared electrical path which is connected to second ends of the individual electrical paths which are opposite sides of the individual resistors than to the first ends connected to the gates of the switches; and (e) a shared resistor which is mounted in the shared electrical path.

The switch unit is, therefore, capable of turning on only on-target(s) that are selected one(s) of the switches required to be turned on.

When an amount of current required to flow through a parallel-connected switch set that is a combination of the switches connected parallel to each other is determined to be larger, the driver circuit increases the number of the on-targets to be larger than that when the amount of current is determined to be smaller. The larger the amount of current flowing through the switches, the higher a rate of change in the current flowing through the switches upon changing of the operating state thereof, thereby resulting in generation of a higher surge voltage. When the surge voltage is high, it usually leads to a risk that the voltage applied to the switch may exceed a permissible upper limit thereof. In order to alleviate this problem, the driver circuit is required to reduce the switching speed when a large amount of current is determined to flow through the parallel-connected switch set.

In order to alleviate the above problem, the driver circuit is designed to have the individual resistors, one mounted in each of the individual electrical paths, and the shared resistor arranged in the shared electrical path. The use of the shared resistor results in an increase in resistance to flow of charging or discharging current to or from the gates of the switches selected as the on-targets through the shared resistor, which leads to a decrease in switching speed. Alternatively, the less the number of the switches selected as the on-targets, the less the resistance to the flow of the charging or discharging current through the shared resistor, thereby enhancing the switching speed.

As apparent from the above discussion, when a small amount of current flows through the parallel-connected switch set, the driver circuit facilitates the flow of charging or discharging current to increase the switching speed, thereby resulting in a decrease in switching loss. Alternatively, a large amount of current flows through the parallel-connected switch set, the driver circuit increases the resistance to the flow of charging or discharging current as a function of the number of the on-targets to lower the switching speed, which reduces a rise in surge voltage.

In the preferred mode, the individual electrical paths are provided as individual discharging paths. The individual resistors are provided as individual discharge resistors. The shared electrical path is provided as a shared discharge path which connects the second ends of the individual discharging paths which are on the opposite sides of the individual discharge resistors to the first ends connected to the gates and grounds to which charges at the gates are discharged. A discharge switch is arranged in the shared discharge path. The switch unit includes charge switches, one for each of the switches, each of which connects the gate of a corresponding one of the switches and an electrical power source and blocking units each of which is arranged in the individual discharging paths and permits a flow of electrical current in a first direction from the gate to the shared discharge path and blocks a flow of electrical current in a second direction opposite the first direction.

The delivery of the charging current to the gate of the switch selected as the on-target is achieved by turning on a corresponding one of the charge switches which is connected to the gate of the on-target. In such as case, the blocking unit(s) arranged in the individual discharging path(s) in connection with the gate of the switch(s) not selected as the on-target(s) works to block flow of the charging current to the gate of the switch not selected as the on-target. This ensures stability in turning on only the switch selected as the on-target.

Usually, the larger the amount of current flowing through the switch, the higher a rate of a decrease in amount of the current through the switch when the switch is turned off, thereby resulting in a rise in surge voltage developed at the switch. In the driver circuit, when the discharge switch is turned on, it will cause electrical current to flow, in other words, be discharged from the gate of the switch being turned on to the ground through a corresponding one of the individual discharging path and the shared electrical path. The installation of the shared resistor in the shared discharge path causes a resistance to flow of the discharging current through the shared resistor to be increased with an increase in number of the switches placed in the on-state, thereby reducing the switching speed. Alternatively, the flow of the discharging current through the shared resistor is facilitated with a decrease in number of the switches placed in the on-state, thereby increasing the switching speed.

As apparent from the above discussion, when a small amount of current is required to flow through the parallel-connected switch set, the flow of the discharging current is facilitated to enhance the switching speed, thereby decreasing the switching loss. Alternatively, when a large amount of current is required to flow through the parallel-connected switch set, the resistance to the flow of the discharging current is increased as a function of the number of the switches placed in the on-state, thereby decreasing the switching speed to reduce a rise in surge voltage at the switches.

In another preferred mode, the individual electrical paths are provided as individual charging paths. The individual resistors are provided as individual charge resistors. The shared electrical path is provided as a shared charge path which connects between a portion of each of the individual charging paths which is on the opposite side of a corresponding one of the individual charge resistors than to the gate of the switch and an electrical power source. The switch unit includes charge switches arranged in the individual charging paths.

The delivery of the charging current to the gate of the switch selected as the on-target from the electrical power source through the shared charge path and a corresponding one of the individual charging paths is achieved by turning on a corresponding one of the charge switches which is connected to the gate of the on-target. In such a case, the charge switches in the individual charging paths connected to the gates of the switches not selected as the on-targets are turned off, thereby blocking the charging current from the electrical power source to the gates of the switches not selected as the on-targets. This ensures the stability in turning on only the switch selected as the on-target.

Usually, the larger the amount of current required to flow through the switch, the higher a rate of an increase in amount of the current flowing through the switch when the switch is turned on, thereby resulting in a rise in surge voltage developed at the switch. The driver circuit has the shared resistor installed in the shared charge path. The installation of the shared resistor in the shared charge path, therefore, causes a resistance to flow of the charging current through the shared resistor to be increased with an increase in number of the switches required to be turned on, thereby reducing the switching speed. Alternatively, the flow of the charging current through the shared resistor is facilitated with a decrease in number of the switches required to be turned on, thereby increasing the switching speed.

As apparent from the above discussion, the driver circuit is capable of facilitating the flow of the charging current when a small amount of current is required to flow through the parallel-connected switch set, thereby enhancing the switching speed to reduce the switching loss. Alternatively, when a large amount of current is required to flow through the parallel-connected switch set, the driver circuit is capable of increasing the resistance to the flow of the charging current as a function of the number of the switches required to be turned on, thereby decreasing the switching speed to minimize an undesirable rise in surge voltage at the switches.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings:

FIGS. 3(a) to 3(f) are timing charts which demonstrate operations of a driver circuit in a low current range according to the first embodiment;

FIGS. 4(a) to 4(f) are timing charts which demonstrate operations of a driver circuit in a high current range according to the first embodiment;

FIGS. 5(a) to 5(f) are timing charts which demonstrate operations of a driver circuit in a high current range according to a modified form of the first embodiment;

FIGS. 13(a) to 13(f) are timing charts which demonstrate operations of a driver circuit in a low current range according to the third embodiment;

FIG. 14(a) to 14(f) are timing charts which demonstrate operations of a driver circuit in a high current range according to the third embodiment.

DESCRIPTION OF THE PREFERRED EMBODIMENTS

First Embodiment

A drive circuit according to the first embodiment will be described below with reference to the drawings. The drive circuit is, as described below, designed as a control system for a rotating electrical machine.

Figure 1:
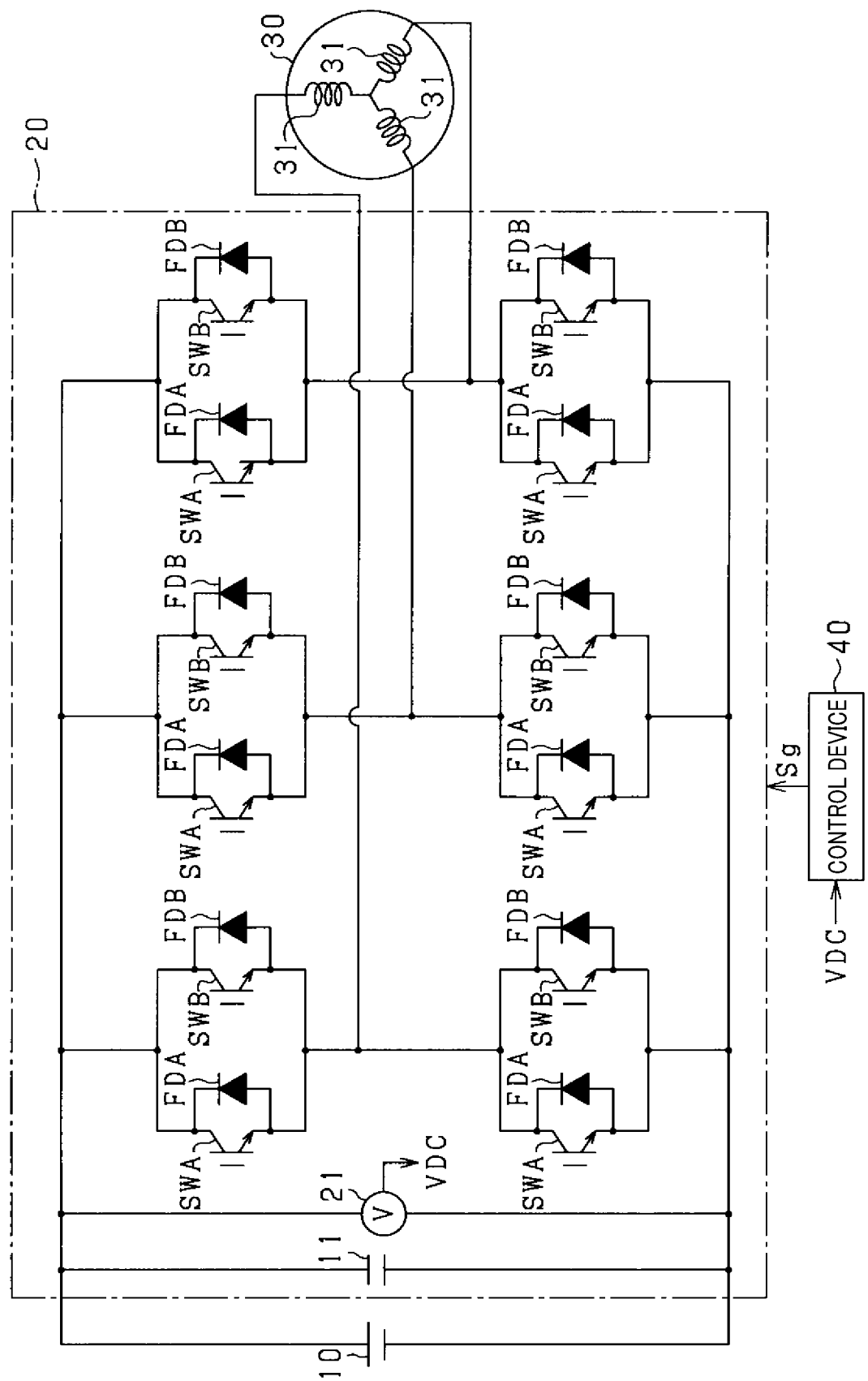
FIG. 1 is a circuit diagram which illustrates an overall structure of a control system for a rotating electrical machine according to the first embodiment.

The control system, as clearly illustrated in FIG. 1, includes the storage battery 10 serving as a dc power supply, the inverter 20 serving as an electrical power converter, the rotating electrical machine 30, and the control device 40. The rotating electrical machine 30 is connected to the storage battery 10 through the inverter 20. The smoothing capacitor 11 is disposed between the storage battery 10 and the inverter 20. The rotating electrical machine 30 may be implemented by a permanent magnet synchronous machine.

The inverter 20 is equipped with upper and lower arm switches for three-phases. Each of upper and lower arms includes the first switch SWA and the second switch SWB connected in parallel to the first switch SWA. The smoothing capacitor 11 is connected at a first end thereof to high-potential terminals of the first and second switches SWA and SWB of the upper arm for each phase. The first and second switches SWA and SWB of the lower arm for each phase are connected at high-potential terminals thereof to low-potential terminals of the first and second switches SWA and SWB of the upper arm for a corresponding one of the phases. The smoothing capacitor 11 is also connected at a second end thereof to low-potential terminals of the first and second switches SWA and SWB of the lower arm for each phase. The rotating electrical machine 30 is equipped with the three-phase windings 30 each of which is connected at a first end thereof to a junction of the low-potential terminals of the first and second switches SWA and SWB of the upper arm and the high-potential terminals of the first and second switches SWA and SWB of the lower arm for a corresponding one of the phases. The three-phase windings 31 have second ends connected together at a neutral point.

In this embodiment, the first and second switches SWA and SWB are each implemented by a voltage-controlled semiconductor switch. Specifically, Si-IGBTs (Insulated Gate Bipolar Transistors) are used as the first and second switches SWA and SWB. Accordingly, each of the first and second switches SWA and SWB has a collector as the high-potential terminal and an emitter as the low-potential terminal. The first and second switches SWA and SWB have the first and second freewheeling diodes FDA and FDB connected in inverse parallel thereto, respectively.

The control system is equipped with the voltage measuring unit 21 which measures voltage appearing between terminals (i.e., the first and second ends) of the smoothing capacitor 11 and outputs it as a power-supply voltage VDC to the control device 40.

The control device 40 works to alternately turn on or off the first and second switches SWA and SWB of the upper arm and the first and second switches SWA and SWB of the lower arm to bring a controlled variable of the rotating electrical machine 30 into agreement with a target one. For instance, the controlled variable represents a degree of torque produced by the rotating electrical machine 30. The control device 40 outputs on-signals or off-signals in the form of drive signals Sg to the driver circuits 50, one provided for the first and second switches SWA and SWB of each of the upper and lower arms for each phase, to turn on or off the first and second switches SWA and SWB.

Figure 2:
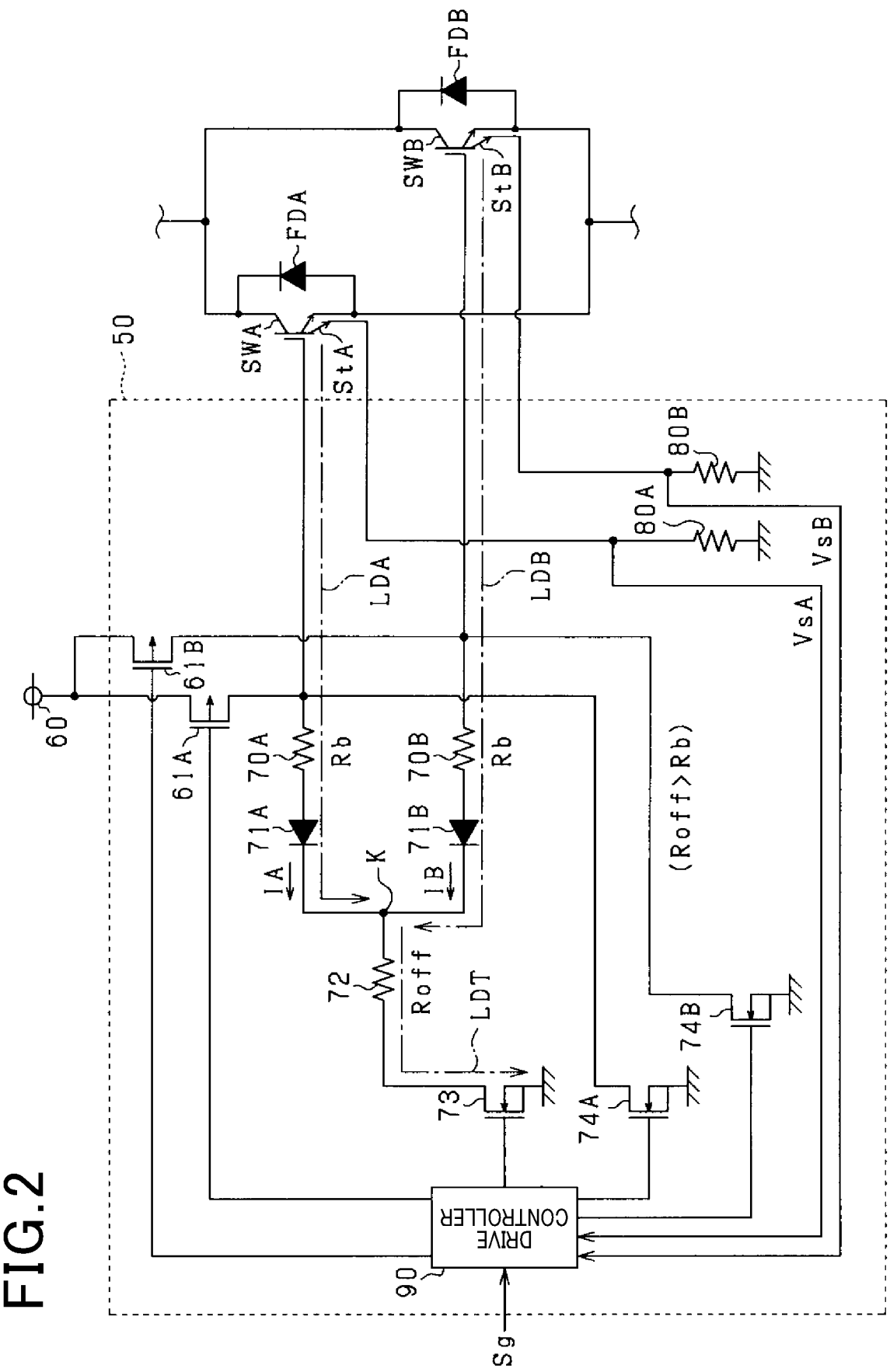
FIG. 2 is a circuit diagram which illustrates a driver circuit for switches according to the first embodiment.

The driver circuit 50 of the inverter 20, as illustrated in FIG. 2, receives the drive signal Sg from the control device 40 and then turns on or off the first and second switches SWA and SWB based on the drive signal Sg. The driver circuit 50 is equipped with the first charge switch 61A, the first discharge resistor 70A, and the first diode 71A. The first charge switch 61A is implemented by a p-channel MOSFET. The first charge switch 61A is also connected at a source thereof to the electrical power source 60. The first charge switch 61A is also connected at a drain thereof to a gate of the first switch SWA. The first switch SWA is connected at a gate thereof to an anode of the first diode 71A through the first discharge resistor 70A.

The driver circuit 50 is also equipped with the second charge switch 61B, the second discharge resistor 70B, and the second diode 71B. The second charge switch 61B is implemented by a p-channel MOSFET. The second charge switch 61B is connected at a source thereof to the electrical power source 60. The second charge switch 61B is also connected at a drain thereof to a gate of the second switch SWB. The second switch SWB is connected at a gate thereof to an anode of the second diode 71B through the second discharge resistor 70B. The second diode 71B and the first diode 71A have cathodes connected together at a junction K.

The driver circuit 50 is also equipped with the shared discharge resistor 72 and the discharge switch 73. The discharge switch 73 is implemented by an n-channel MOSFET. The shared discharge resistor 72 is connected at a first end thereof to the junction K. The shared discharge resistor 72 is also connected at a second end thereof to a drain of the discharge switch 73. The discharge switch 73 is connected at a source thereof to emitters (i.e., grounds) of the first and second switches SWA and SWB.

An electrical path extending from the gate of the first switch SWA to the junction K through the first discharge resistor 70A and the first diode 71A will also be referred to below as the first discharge path LDA for the first switch SWA. An electrical path extending from the gate of the second switch SWB to the junction K through the second discharge resistor 70B and the second diode 71B will also be referred to below as the second discharge path LDB for the second switch SWB. An electrical path extending from the junction K to the emitters of the first and second switches SWA and SWB through the shared discharge resistor 72 and the discharge switch 73 will also be referred to below as the shared discharge path LDT.

In the first embodiment, the first and second charge switch 61A and 61B and the first and second diodes 71A and 71B function as a switch unit. The first and second diodes 71A and 71B also serve as a blocking unit.

The driver circuit 50 is also equipped with the first off-hold switch 74A and the second off-hold switch 74B. In this embodiment, the first and second off-hold switches 74A and 74B are each implemented by an n-channel MOSFET. The first off-hold switch 74A is connected at a drain thereof to a portion of the first discharge path LDA closer to the gate of the first switch SWA than the first discharge resistor 70A is. The first off-hold switch 74A is connected at a source thereof to the emitter of the first switch SWA. The second off-hold switch 74B is connected at a drain thereof to a portion of the second discharge path LDB closer to the gate of the second switch SWB than the second discharge resistor 70B is. The second off-hold switch 74B is also connected at a source thereof to the emitter of the second switch SWB.

The first switch SWA is equipped with the first sense terminal StA through which a minute electric current flows which correlates with a collector current flowing in the first switch SWA. The first sense terminal StA is connected to a first end of the first sense resistor 80A. The first sense resistor 80A is also connected at a second end thereof to the emitter of the first switch SWA. A flow of minute electric current in the first sense terminal StA results in a drop in voltage at the first sense resistor 80A. The first sense voltage VsA that is potential developed at the first end of the first sense resistor 80A close to the first sense terminal StA, therefore, represents an electrical quantity correlating with the collector current in the first switch SWA. In this embodiment, the emitter voltage at the first switch SWA is set to zero. The sign of the first sense voltage VsA higher in level than the emitter voltage at the first switch SWA is defined as being positive (+). The first sense voltage VsA is inputted to the drive controller 90 installed in the driver circuit 50.

The second switch SWB is equipped with the second sense terminal StB through which a minute electric current flows which correlates with a collector current flowing in the second switch SWB. The second sense terminal StB is connected to a first end of the second sense resistor 80B. The second sense resistor 80B is also connected at a second end thereof to the emitter of the second switch SWB. The second sense voltage VsB that is a potential developed at the first end of the second sense resistor 80B close to the second sense terminal StB, therefore, represents an electrical quantity correlating with the collector current in the second switch SWB. In this embodiment, the emitter voltage at the second switch SWB is set to zero. The sign of the second sense voltage VsB higher in level than the emitter voltage at the second switch SWB is defined as being positive (+). The second sense voltage VsB is inputted to the drive controller 90. The drive controller 90 functions to measure the gate voltage at each of the first switch SWA and the second switch SWB.

The drive controller 90 receives the drive signal Sg outputted by the control device 40. The drive controller 90 analyzes the drive signal Sg, the first sense voltage VsA, and the second sense voltage VsB to drive the first and second switches SWA and SWB. When determining that the total sense voltage Vse that is the sum of the first sense voltage VsA and the second sense voltage VsB is lower than or equal to a reference voltage Va (i.e., a criteria value), the drive controller 90 concludes that the sum of collector currents (which will also be referred to as a total current) flowing in the first and second switches SWA and SWB lies in a low current range (which will also be referred to below as a second current range), turns on or off the first switch SWA, and keeps the second switch SWB in an off-state in response to the drive signal Sg.

Alternatively, when determining that the total sense voltage Vse is higher than the reference voltage Va, the drive controller 90 concludes that the sum of the collector currents flowing in the first and second switches SWA and SWB lies in a high current range (which will also be referred to below as a first current range) and then turns on or off the first and second switches SWA and SWB synchronously with each other in response to the drive signal Sg.

In this embodiment, the total sense voltage Vse used in determining that the sum of the collector currents flowing in the first and second switches SWA and SWB lies in the low current range or the high current range is selected to be the sum of the first sense voltage VsA and the second sense voltage VsB measured in an on-duration for which the drive signal Sg was last produced as the on-signal. Specifically, the total sense voltage Vse set to the sum of the first sense voltage VsA and the second sense voltage VsB measured at the end of the last on-duration for which the drive signal Sg was outputted as the on-signal. Afterwards, when the drive signal Sg is changed to the off-signal, the drive controller 90 determines which of the low current range and the high current range the above sum of the collector currents lines in an off-duration in which the drive signal Sg is produced as the off-signal to determine which of the first and second switches SWA and SWB should be selected as a target switch needed to be turned on in a subsequent on-duration in which the drive signal Sg is produced as the on-signal.

The operation of the driver circuit 50 in the low current range where the total sense voltage Vse is determined to be lower than or equal to the reference voltage Va will be discussed below with reference to FIGS. 3(a) to 3(f). FIG. 3(a) demonstrates a change in level of the drive signal Sg inputted to the drive controller 90. FIGS. 3(b) and (c) demonstrate driven states, i.e., on- or off-states of the first and second discharge switches 61A and 61B. FIG. 3(d) demonstrates a driven or operating state of the discharge switch 73. FIGS. 3(e) and (f) demonstrate driven or operating states of the first and second off-hold switches 74A and 74B.

In the low current range, the drive controller 90 keeps the second charge switch 61B in the off-state and also keeps the second off-hold switch 74B in the on-state. This causes the gate voltage at the second switch SWB to be lower than the threshold voltage Vth, so that the second switch SWB is kept off.

When determining that the drive signal Sg is produced as the on-signal, the drive controller 90 turns on the first charge switch 61A and turns off the discharge switch 73 and the first off-hold switch 74A. This causes the gate voltage at the first switch SWA to be higher than or equal to the threshold voltage Vth, so that the first switch SWA is turned on.

Alternatively, when determining that the drive signal Sg is produced as the off-signal, the drive controller 90 turns off the first charge switch 61A and turns on the discharge switch 73. This causes the gate voltage at the first switch SWA to be lower than the threshold voltage Vth, so that the first switch SWA is turned off. Additionally, when determining that the drive signal Sg is produced as the off-signal, and the gate voltage at the first switch SWA has become lower than or equal to the threshold voltage Vth, the drive controller 90 switches the operating state of the first off-hold switch 74A to the on-state. The conditions to switch the first off-hold switch 74A to the on-state include a condition about the gate voltage. Actually, the first off-hold switch 74A is, therefore, turned on after the discharge switch 73 is changed to the on-state. For the sake of convenience, FIGS. 3(d) and 3(e) illustrate the time when the discharge switch 73 is turned on as coinciding with that when the first off-hold switch 74A is turned on.

In the low current range, only one of the first and second charge switches 61A and 61B, that is, the first charge switch 61A is turned on, so that a charging current is delivered from the electrical power source 60 to the gate of only the first switch SWA. The second diode 71B is arranged in the second discharge path LDB, so that it blocks delivery of the charging current from the electrical power source 60 to the gate of the second switch SWB. This enables only the first switch SWA to be changed to the on-state.

The operation of the driver circuit 50 in the high current range where the total sense voltage Vse is determined to exceed the reference voltage Va will be described below with reference to FIGS. 4(a) to 4(f). FIGS. 4(a) to 4(f) correspond to FIGS. 3(a) to 3(f).

When determining that the drive signal Sg is produced as the on-signal, the drive controller 90 turns on the first and second charge switches 61A and 61B and turns off the discharge switch 73 and the first and second off-hold switches 74A and 74B, thereby turning on the first and second switches SWA and SWB.

Alternatively, when determining that the drive signal Sg is produced as the off-signal, the drive controller 90 turns off the first and second charge switches 61A and 61B and turns on the discharge switch 73, thereby turning off the first and second switches SWA and SWB. When determining that the drive signal Sg is produced as the off-signal, and the gate voltage at the first switch SWA has dropped below the threshold voltage Vth, the drive controller 90 changes the first off-hold switch 74A to the off-state. When determining that the drive signal Sg is produced as the off-signal, and the gate voltage at the second switch SWB has dropped below the threshold voltage Vth, the drive controller 90 changes the second off-hold switch 74B to the on-state. For the sake of convenience, FIGS. 4(d) to 4(f) illustrate the time when the discharge switch 73 is turned on as coinciding with those when the first and second off-hold switches 74A and 74B are turned on.

In other words, in the high current range, the drive controller 90 works to change the discharge switch 73 shared by the first and second switches SWA and SWB to the on-state to turn off the first and second switches SWA and SWB. This minimizes current unbalance and switching loss. The current unbalance is a phenomenon in which amounts of collector current flowing in the first and second switches SWA and SWB are greatly different from each other. Deviation of the time when the first switch SWA is changed to the off-state from that when the second switch SWB is changed to the off-state will result in a decrease in collector current flowing in one of the first and second switches SWA and SWB which has been earlier turned off. The collector current in the other of the first and second switches SWA and SWB which is not yet turned off is increased temporarily and then begins to be decreased. This will result in a great deviation between the amounts of collector current flowing through the first and second switches SWA and SWB.

In the high current range, the drive controller 90, as demonstrated in FIGS. 5(a) to 5(f), may alternatively be engineered to turn off the second charge switch 61B and turn on the second off-hold switch 74B at time t1 before time t2 in response to the drive signal Sg being changed to the off-signal and then turn on the discharge switch 73 at time t2. In this case, the second switch SWB which needs to be turned off earlier than the first switch SWA is turned off by changing the second off-hold switch 74B to the on-state. FIGS. 5(a) to 5(f) correspond to FIGS. 4(a) to 4(f).

An electrical path extending from the gate of the second switch SWB to the emitter of the second switch SWB through the second off-hold switch 74B has a resistance value smaller than that of an electrical path extending from the gate of the second switch SWB to the emitter of the second switch SWB through the second discharge resistor 70B, the shared discharge resistor 72, and the discharge switch 73. This results in an increase in switching speed at which the second switch SWB is switched to the off-state in the structure wherein the second switch SWB is changed to the off-state by turning on the second off-hold switch 74B, thereby reducing the switching loss. Turning off the second switch SWB will result in no surge voltage because the first switch SWA is still kept in the on-state.

In this disclosure, the switching speed at which the switch is changed to the off-state represents a period of time between when the gate voltage at the switch starts to drop and when the gate voltage drops below the threshold voltage Vth.

The switching speed at which the first and second switches SWA and SWB are turned off will be discussed below with reference to FIGS. 6(a) and 6(b). Note that the switching speed at which the switch is changed to the on-state, as referred to in this disclosure, is a period of time when the gate voltage at the switch starts to rise from zero and when the gate voltage reaches the threshold voltage Vth.

In the following discussion, electrical current flowing through the first discharge resistor 70A is defined as IA. The electrical current flowing through the second discharge resistor 70B is defined as IB. In the low current range where the total sense voltage Vse is lower than or equal to the reference voltage Va, the current is discharged from the gate of only one of the first and second switches SWA and SWB, that is, the first switch SWA. Such discharged current flows through the first discharge resistor 70A and the shared discharge resistor 72. If the gate voltage developed at the first switch SWA is defined as Vg, a discharge path extending from the gate of the first switch SWA to the first discharge resistor 70A, to the junction K, to the shared discharge resistor 72, to the discharge switch 73, and then to the emitter of the first switch SWA experiences a voltage drop expressed by the following equation Eq. 1.

$$Vg = IA \times R_{off} + IA \times Rb \qquad \text{Eq. 1}$$
$$= IA \times (R_{off} + Rb)$$

where $R_{off}$ is a resistance value of the shared discharge resistor 72, and Rb is a resistance value of the first discharge resistor 70A.

In the following discussion, the right side of Eq. 1, that is, ($R_{off}$+Rb) will also be referred to below as the first discharge resistance Rd1. In this embodiment, the first discharge resistor 70A and the second discharge resistor 70B have the same value of resistance.

In the high current range where the total sense voltage Vse is higher than the reference voltage Va, current is discharged from the gates of both the first and second switches SWA and SWB. Specifically, the current discharged from the gate of the first switch SWA flows through the first discharge resistor 70A. The current discharged from the gate of the second switch SWB flows through the second discharge resistor 70B. The current discharged from the gates of both the first and second switches SWA and SWB flows through the shared discharge resistor 72. A discharge path extending from the gate of the first switch SWA, to the first discharge resistor 70A, to the junction K, to the shared discharge resistor 72, to the discharge switch 73, and to the emitter of the first switch SWA undergoes a voltage drop expressed by the following Eq. 2.

$$Vg=(IA+IB)\times R_{off}+IA\times Rb \qquad \text{Eq. 2}$$

If IA=IB=Idis, Eq. 2 can be rewritten as Eq. 3 below.

$$Vg=Idis\times(2\times R_{off}+Rb) \qquad \text{Eq. 3}$$

In the following discussion, the right side of Eq. 3, that is, ($2\times R_{off}$+Rb) will be referred to as the second discharge resistance Rd2.

Eqs. 1 and 3 show that the second discharge resistance Rd2 in the high current range is larger than the first discharge resistance Rd1 in the low current range.

The second discharge resistance Rd2 is determined in the following way.

The surge voltage occurs when the first and second switches SWA and SWB are turned off. The higher the switching speed at which the first and second switches SWA and SWB are turned off or the larger the collector current in the first and second switches SWA and SWB, the higher the surge voltage will be. If the value of the total sense voltage Vse that is a permissible upper limit of the sum of collector currents flowing in a parallel-connected switch set that is a combination of the first and second switches SWA and SWB connected parallel to each other is defined as a maximum voltage Vsmax, the switching speed of the first and second switches SWA and SWB, that is, the second discharge resistance Rd2 is selected so that a collector-to-emitter voltage at the first and second switches SWA and SWB upon turning off of the first and second switches SWA and SWB will be lower than or equal to the permissible upper limit when the total sense voltage Vse becomes the maximum voltage Vsmax.

The shared discharge resistor 72 is, as described above, arranged in the shared discharge path LDT. This creates an increased resistance to flow of current discharged from the gates of both the first and second switches SWA and SWB, thus resulting in a decrease in switching speed thereof. The resistance Rdis in the discharge path, as indicated by a solid line in FIG. 6(a), will be the second discharge resistance Rd2. Alternatively, flowing of current discharged from the gate of only the first switch SWA is facilitated, so that the switching speed thereof is increased. In this case, the resistance Rdis in the discharge path will be, as indicated by a solid line in FIG. 6(a), the first discharge resistance Rd1 (<Rd2). FIG. 6(b) represents the switching speed.

As apparent from the above discussion, in the low current range, the control system in this embodiment facilitates the flow of the discharged electrical current to increase the switching speed, thereby minimizing the switching loss. In the high current range, the control system increases the resistance to the flow of the discharged electrical current to decrease the switching speed to be lower than that when the resistance Rdis in the discharge path is set to the first discharge resistance Rd1, thereby eliminating the risk of a rise in surge voltage.

Figure 6A:
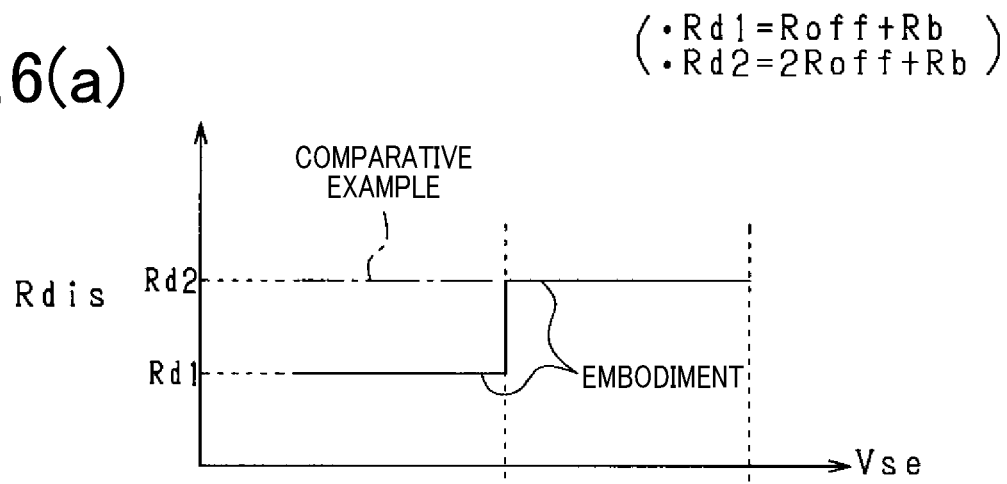
FIGS. 6(a) and 6(b) demonstrate relations among a resistance in a discharge path, a switching speed, and an electrical current flowing through parallel-connected first and second switches.
Figure 6B:
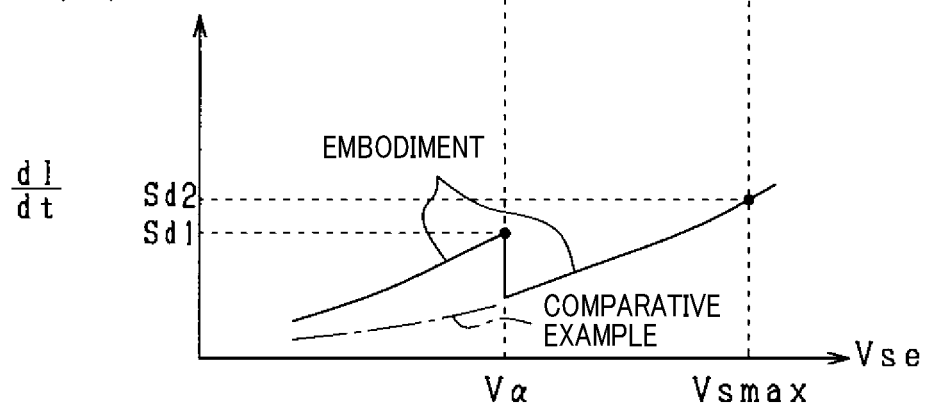

It is, however, difficult for the comparative example indicated by a chain line in FIGS. 6(a) and 6(b) to enhance the switching speed in the low current range. The comparative example is designed to have a structure wherein the drive circuit 50 is not equipped with the shared discharge resistor 72, and the drain of the discharge switch 73 is joined, i.e., short-circuited to the junction K.

In the comparative example, the resistance Rdis in the discharge path is, as indicated by the chain line in FIG. 6(a), set to the second discharge resistance Rd2 regardless of the low and high current ranges, so that the resistance Rdis is kept high in the low current range, thereby causing the switching speed in the low current range to be lower than that in the structure of the first embodiment, which leads to an increase in switching loss in the low current range.

Each of the first and second discharge resistors 70A and 70B, as described above, has the resistance Rb lower than the resistance $R_{off}$ of the shared discharge resistor 72, thereby enabling the first discharge resistance Rd1 to be lower than the second discharge resistance Rd2 to increase the switching speed in the low current range.

The resistance value of each of the first and second discharge resistors 70A and 70B and the shared discharge resistor 72 is, as can be seen in FIG. 6(b), selected so that the switching speed Sd2 when the total sense voltage Vse becomes the maximum voltage Vsmax is higher than the switching speed Sd1 when the total sense voltage Vse becomes the reference voltage Va. This ensures the stability in decreasing the collector-to-emitter voltage at each of the first and second switches SWA and SWB to be lower than its permissible level even when the total sense voltage Vse is lower than the maximum voltage Vmax, and the surge voltage occurs.

Modification of the First Embodiment

Figure 7:
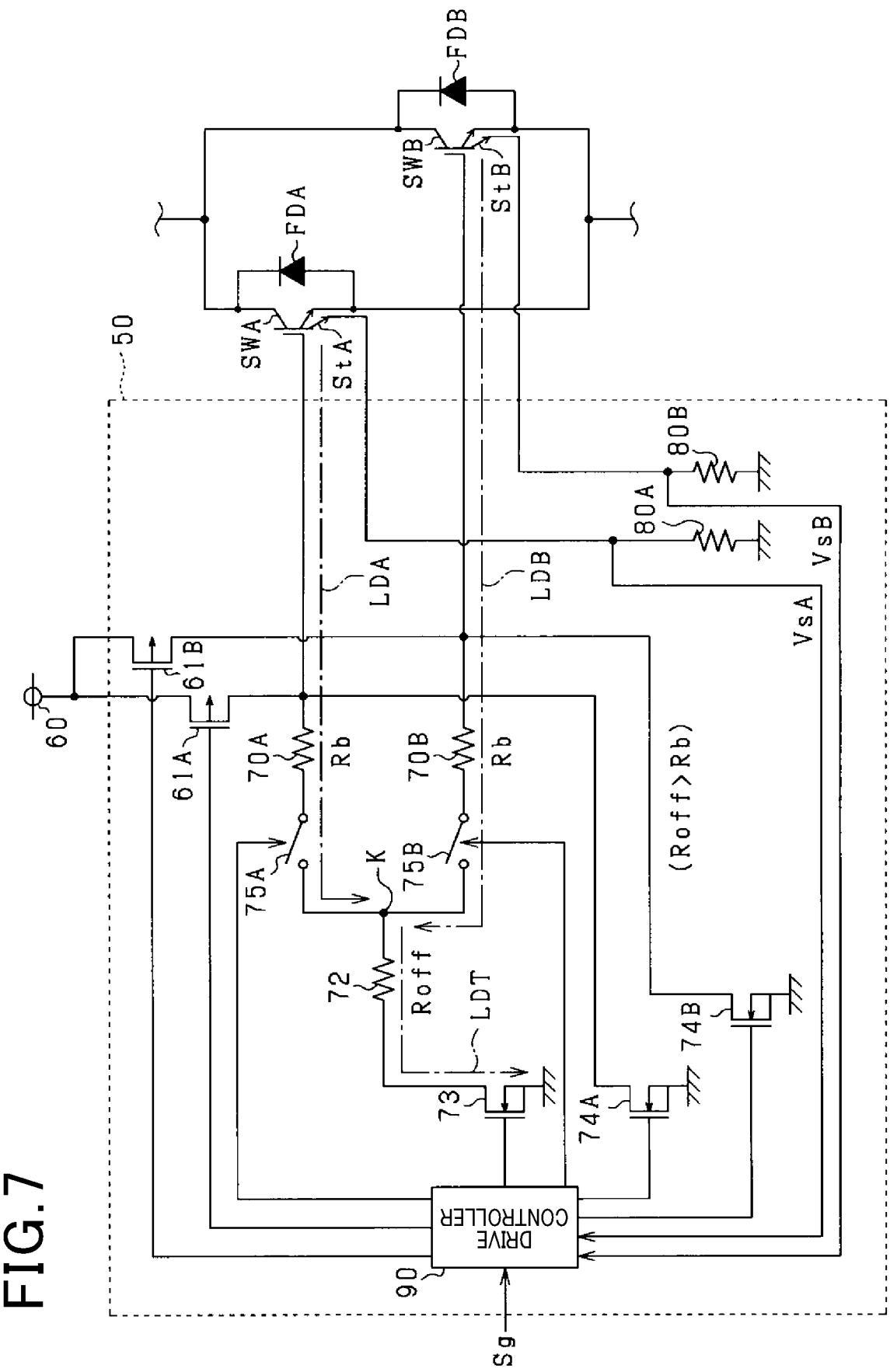
FIG. 7 is a circuit diagram which illustrates a driver circuit for switches according to a modified form of the first embodiment.

FIG. 7 illustrates a modified structure of the driver circuit 50. Specifically, the driver circuit 50 is equipped with the first discharge block switch 75A serving as a blocking unit instead of the first diode 71A. The driver circuit 50 is also equipped with the second discharge block switch 75B serving as a blocking unit instead of the second diode 71B. When determining that the drive signal Sg is produced as the on-signal, the control circuit 50 turns off the first and second discharge block switches 75A and 75B. Alternatively, when determining that the drive signal Sg is produced as the off-signal, the driver circuit 50 turns on the first and second discharge block switches 75A and 75B. In FIG. 7, the same reference numbers as employed in FIG. 2 refer to the same parts, and explanation thereof in detail will be omitted here.

Second Embodiment

The second embodiment will be described below in terms of parts different from those in the first embodiment.

Figure 8:
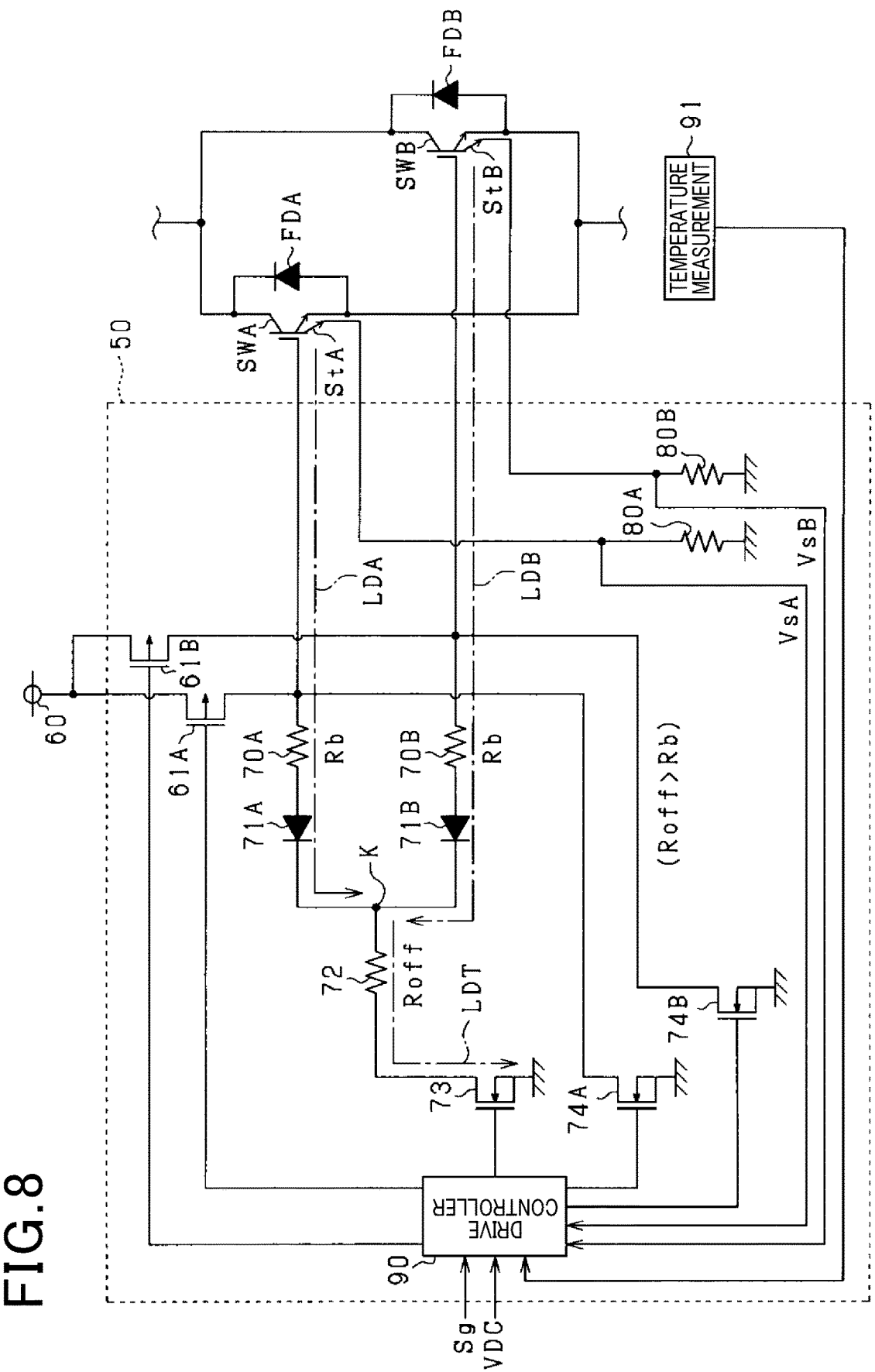
FIG. 8 is a circuit diagram which illustrates a driver circuit for switches according to the second embodiment.

The control system in the second embodiment is, as illustrated in FIG. 8, equipped with the temperature measuring unit 91. The temperature measuring unit 91 works to determine the temperature of the first and second switches SWA and SWB and outputs a temperature signal indicative thereof. The temperature measuring unit 91 is made of, for example, a temperature sensitive or thermostatic diode and outputs the temperature signal to the drive controller 90. The drive controller 90 analyzes the temperature signal to calculate the switch temperature TD indicating the temperature of the first and second switches SWA and SWB. In FIG. 8, the same reference numbers as employed in FIG. 2 refer to the same parts, and explanation thereof in detail will be omitted here.

Figure 9:
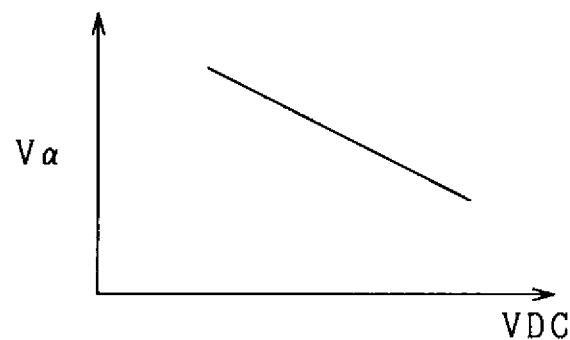
FIG. 9 is a graph which represents a relation between a power source voltage and a reference voltage.

The drive controller 90 receives the power-supply voltage VDC outputted from the control device 40. The drive controller 90 works as a selector to select or determine the reference voltage Va, as illustrated in FIG. 9, to be increased with a decrease in the power-supply voltage VDC. This determination is made in view of the fact that a margin between the collector-to-emitter voltage at the first and second switches SWA and SWB and the permissible upper limit thereof upon generation of the surge voltage is increased with a decrease in terminal-to-terminal voltage at the smoothing capacitor 11. This reduces the switching loss in the low current range.

Figure 10:
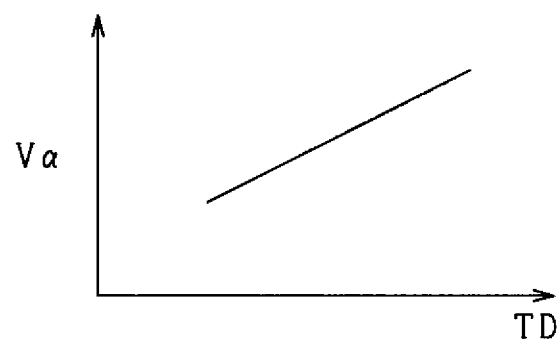
FIG. 10 is a graph which represents a relation between the temperature of a switch and a reference voltage.

The drive controller 90 variably determines the reference voltage Va as a function of the switch temperature TD. For instance, the reference voltage Va is, as illustrated in FIG. 10, determined to be increased with an increase in switch temperature TD in view of the fact that the higher the switch temperature TD, the lower the switching speed will be, thereby reducing the surge voltage, and the higher the switch temperature TD, the higher the permissible upper limit of the collector-to-emitter voltage at the first and second switches SWA and SWB will be. This minimizes the surge voltage and also reduces the switching loss as a function of the switch temperature TD.

Figure 11A:
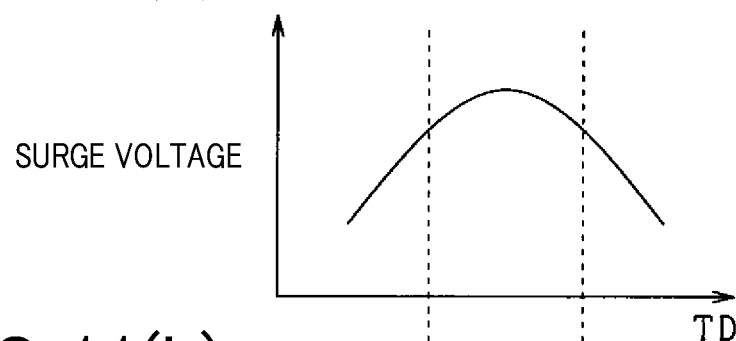
FIG. 11(a) is a graph which represents a relation between a surge voltage and the temperature of a switch.
Figure 11B:
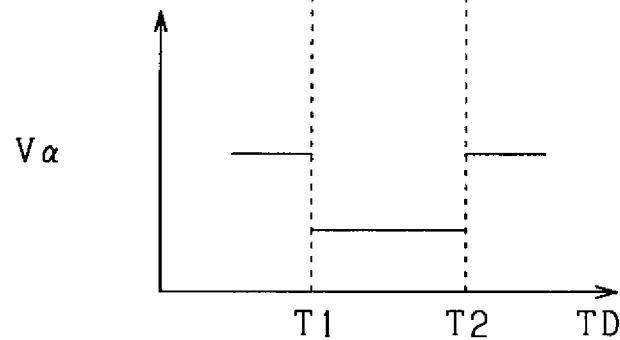
FIG. 11(b) is a graph which represents a relation between a reference voltage and the temperature of a switch.

The surge voltage, as demonstrated in FIG. 11(a), may have a single local maximum value in a range of the switch temperature TD during operation of the control system in addition to the fact that the higher the switch temperature TD, the lower the surge voltage. This is because in a closed circuit including the smoothing capacitor 11 and the freewheeling diodes FDA and FDB, an increase in the switch temperature TD will result in an increase in surge voltage generated at the freewheeling diodes FDA and FDB, but result in a decrease in surge voltage occurring in an electrical circuit other than the freewheeling diodes FDA and FDB. In such a case, when the surge voltage is relatively increased, the drive controller 90 may determine the reference voltage Va to be lower than when the surge voltage is relatively decreased. Such an example will be specifically described with reference to FIG. 11(b). When determining that the switch temperature TD is higher than or equal to the first temperature T1, but lower than or equal to the second temperature T2, the drive controller 90 determines the reference voltage Va to be lower than that when determining that the switch temperature TD is lower than the first temperature T1 or higher than the second temperature T2.

As apparent from the above discussion, the driver circuit 50 in this embodiment includes a selector (i.e., the drive controller 90 which selects two or more of the switches as on-targets (i.e., the switches SWA, SWB) required to be turned on in the first current range and, in the second current range lower in current than the first current range, selects one(s) of the switches smaller in number than the on-targets selected in the first current range as an on-target(s) (SWA) required to be turned on. When determining that a total current flowing through a parallel-connected switch set that is a combination of the switches connected in parallel to each other is lower than or equal to a reference value, the selector determines that the total current lies in the second current range. Alternatively, when determining that the total current is higher than the reference value, the selector determines that the total current lies in the first current range. The selector variably determines the reference value as a function of the temperature of the switches.

Third Embodiment

Figure 12:
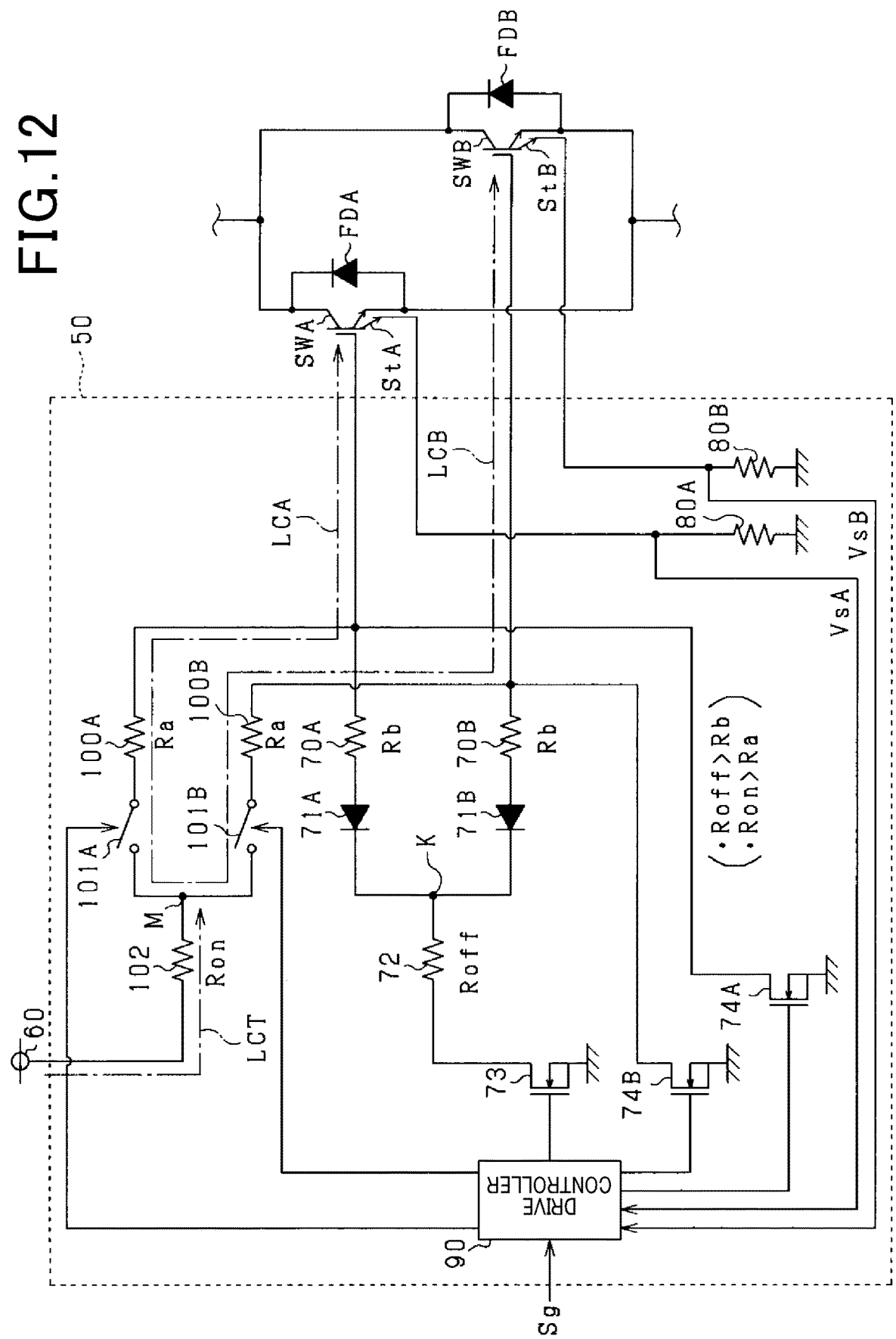
FIG. 12 is a circuit diagram which illustrates a driver circuit for switches according to the third embodiment.

The third embodiment will be described below in terms of parts different from those in the first embodiment. The control system in the third embodiment is, as illustrated in FIG. 12, different from the first embodiment in a charging circuit connected to the gates of the first and second switches SWA and SWB. In FIG. 12, the same reference numbers as employed in FIG. 2 refer to the same parts, and explanation thereof in detail will be omitted here.

The driver circuit 50 includes the shared charge resistor 102, the first charge switch 101A, the first charge resistor 100A, the second charge switch 101B, and the second charge resistor 100B. The electrical power source 60 is connected to the junction M through the shared charge resistor 102. The junction M is connected to the gate of the first switch SWA through the first charge switch 101A and the first charge resistor 100A. The junction M is also connected to the gate of the second switch SWB through the second charge switch 101B and the second charge resistor 100B.

In the following discussion, an electrical path extending from the electrical power source 60 to the junction M through the shared charge resistor 102 will be referred to as the shared charge path LCT. An electrical path extending from the junction M to the gate of the first switch SWA through the first charge switch 101A and the first charge resistor 100A will be referred to as the first charge path LCA for the first switch SWA. An electrical path extending from the junction M to the gate of the second switch SWB through the second charge switch 101B and the second charge resistor 100B will be referred to as the second charge path LCB for the second switch SWB.

In this embodiment, the first and second charge switches 101A and 101B serve as a switch unit.

The operations of the driver circuit 50 in the low current range where the total sense voltage Vse is determined to be lower than or equal to the reference voltage Va will be described below with reference to FIGS. 13(a) to 13(f). FIGS. 13(a) and 13(d) to 13(f) correspond to FIGS. 3(a) and 3(d) to 3(f). FIGS. 13(b) and 13(c) demonstrate on- or off-state of the first and second charge switches 101A and 101B, respectively.

In the low current range, the first charge switch 101A is driven in the same way as the first charge switch 61A described with reference to FIGS. 3(a) to 3(f). Similarly, the second charge switch 101B is driven in the same way as the second charge switch 61B described with reference to FIGS. 3(a) to 3(f).

The operations of the driver circuit 50 in the high current range where the total sense voltage Vse is determined to exceed the reference voltage Va will be described with reference to FIGS. 14(a) to 14(f). FIGS. 14(a) to 14(f) correspond to FIGS. 13(a) to 13(f).

In the high current range, the first charge switch 101A is driven in the same way as the first charge switch 61A described with reference to FIGS. 4(a) to 4(f). Similarly, the second charge switch 101B is driven in the same way as the second charge switch 61B described with reference to FIGS. 4(a) to 4(f).

The switching speed at which the first and second switches SWA and SWB are turned on will be described below with reference to FIGS. 15(a) and 15(b).

In the low current range where the total sense voltage Vse is lower than or equal to the reference voltage Va, a charging current is delivered from the electrical power source 60 to the gate of only one of the first and second switches SWA and SWB, that is, the first switch SWA. Such a charging current flowing through the shared charge resistor 102 and the first charge resistor 100A is referred to as the charging current IC. The gate voltage at the first switch SWA is defined as Vg. A voltage drop occurring in a charge path extending from the electrical power source 60 to the gate of the first switch SWA through the shared charge resistor 102, the junction M, the first charge switch 101A, and the first charge resistor 100A meets Eq. 4 below.

$$Vg = IC \times Ron + IC \times Ra \qquad \text{Eq. 4}$$
$$= IC \times (Ron + Ra)$$

where Ron is a resistance value of the shared charge resistor 102, and Ra is a resistance value of the first charge resistor 100A.

In the following discussion, the right side (Ron+Ra) of Eq. 4 is defined as the first charge resistance Rc1. In this embodiment, the first charge resistor 100A and the second charge resistor 100B have the same resistance value.

In the high current range where the total sense voltage Vse exceeds the reference voltage Va, the charging current is delivered from the electrical power source 60 to the gates of both the first and second switches SWA and SWB. If the charging current flowing through the second charge resistor 100B is defined as ID, a voltage drop occurring in a charge path extending from the electrical power source 60 to the gate of the first switch SWA through the shared charge resistor 102, the junction M, the first charge switch 101A, and the first charge resistor 100A meets Eq. 5 below.

$$Vg=(IC+ID) \times Ron+IC \times Ra \qquad \text{Eq. 5}$$

If IC=ID=Ich, Eq. 5 can be rewritten as Eq. 6.

$$Vg=Ich \times (2 \times Ron+Ra) \qquad \text{Eq. 6}$$

The right side (2×Ron+Ra) of Eq. 6 will be referred to below as the second charge resistance Rc2. Eqs. 4 and 6 show that the second charge resistance Rc2 in the high current range is greater than the first charge resistance Rc1 in the low current range.

The second charge resistance Rc2 is determined in the following way.

Usually, the surge voltage occurs upon turning on of the first and second switches SWA and SWB. The surge voltage is usually increased with an increase in switching speed at which the first and second switches SWA and SWB are turned on or collector current in the first and second switches SWA and SWB. In view of this fact, the switching speed of the first and second switches SWA and SWB, that is, the second charge resistance Rc2 is selected so that the collector-to-emitter voltage at the first and second switches SWA and SWB when the first and second switches SWA and SWB are turned on is lower than or equal to the permissible upper limit thereof in a condition where the total sense voltage Vse after the first and second switches SWA and SWB are turned on is expected to become the maximum voltage Vsmax.

The shared charge path LCT has the shared charge resistor 102 arranged therein. This produces an increased resistance to flow of charging current to the gates of the first and second switches SWA and SWB, thereby resulting in a decrease in switching speed. In this case, the resistance Rch in the charge path, as indicted by a solid line in FIG. 15(a), becomes the second charge resistance Rc2. Alternatively, a resistance to the flow of the charging current to the gate of only the first switch SWA is decreased, thus resulting in an increase in switching speed. In this case, the resistance Rch in the charge path, as indicated by a solid line in FIG. 15(a), becomes the first charge resistance Rc1 (<Rc2). FIG. 15(b) represents the switching speed.

As apparent from the above discussion, the control system of this embodiment serves to facilitate the ease of flow of charging current to enhance the switching speed, thereby resulting in a decrease in switching loss in the low current range. In the high current range, the control system also produces an increased resistance to the flow of charging current to decrease the switching speed to be lower than that when the resistance Rch in the charge path is set to the first charge resistance Rc1, thereby minimizing a undesirable rise in surge voltage.

Figure 15A:
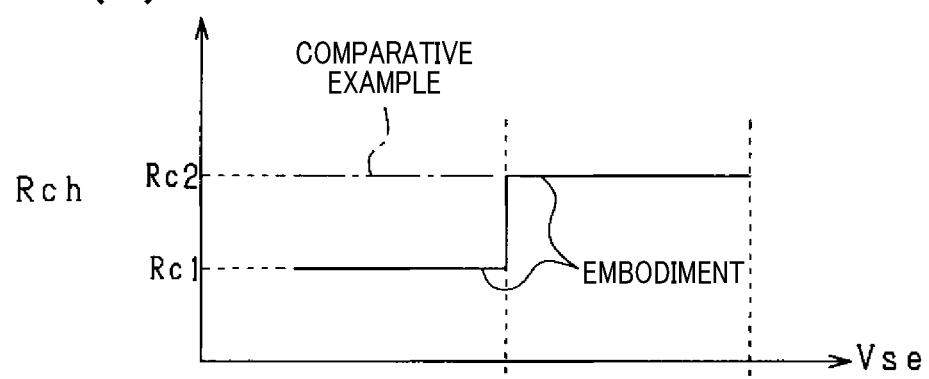
FIGS. 15(a) and 15(b) demonstrate relations among a resistance in a charge path, a switching speed, and electrical current flowing through parallel-connected first and second switches.
Figure 15B:
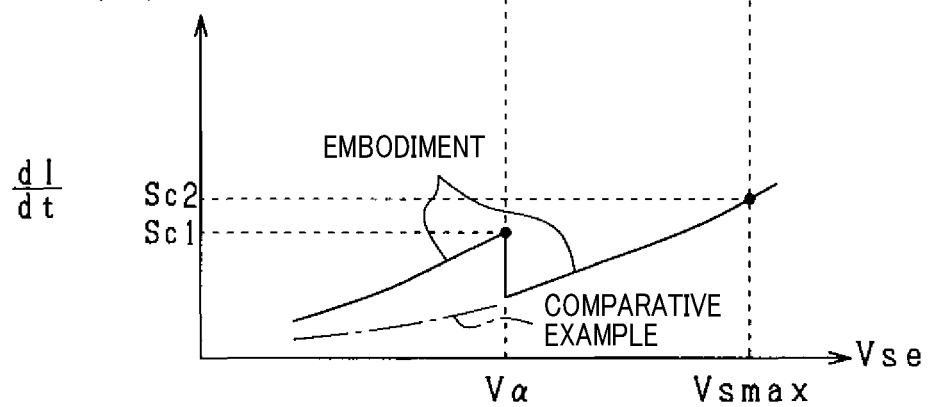

It is, however, impossible for a comparative example in which the driver circuit 50 is not equipped with the shared charge resistor 102 shown in FIG. 12 to enhance, as indicated by a chain line in FIG. 15(b), the switching speed in the low current range. In the comparative example, the electrical power source 60 is connected or short-circuited to the junction M.

In the comparative example, the resistance Rch in the charge path is, as indicated by the chain line in FIG. 15(a), set to the second discharge resistance Rc2 regardless of the low and high current ranges, so that the resistance is kept high in the low current range, thereby causing the switching speed in the low current range to be lower than that in the structure of the third embodiment, which leads to an increase in switching loss in the low current range.

The first and second charge resistors 100A and 100B in this embodiment are engineered to have the resistance Ra lower than the resistance Ron of the shared charge resistor 102, so that the first charge resistance Rc1 is much lower than the second charge resistance Rc2, thereby enhancing the switching speed in the low current range.

The resistance of each of the first and second charge resistors 100A and 100B and the shared charge resistor 102 is, as shown in FIG. 15(b), selected so that the switching speed Sc2 when the total sense voltage Vse becomes the maximum voltage Vsmax is higher than the switching speed Sc1 when the total sense voltage Vse becomes the reference voltage Va. This ensures the stability in decreasing the collector-to-emitter voltage at the first and second switches SWA and SWB to be lower than the permissible upper limit thereof even upon generation of the surge voltage when the first and second switches SWA and SWB are turned on in a condition where the total sense voltage Vse is expected to be lower than the maximum voltage Vsmax when at least the first switch SWA is in the on-state.

Modifications

The above embodiments may be modified in the following ways.

In each of the above embodiments, the control system may not be equipped with the first and second off-hold switches 74A and 74B.

The number of switches connected in parallel to each other is not limited to two, but may be three or more. Inn such a case, the number of the switches required to be turned on in the high current range is set larger than that in the low current range.

In the case where the number of the switches connected in parallel to each other is three or more, the control system may be designed to operate in three or more current ranges. For instance, the control system may operate in a low current range, an intermediate current range higher in current than the low current range, and a high current range higher in current than the intermediate current range. In such a case, the higher of the adjacent two current ranges corresponds to the first current range, while the smaller corresponds to the second current range.

The ground to which the source of the discharge switch 73 and the source of each of the first and second off-hold switches 74A and 74B is not limited to the emitter of the first switch SWA or the second switch SWB, but may be a negative voltage source which is lower in potential than the emitter of each of the first and second switches SWA and SWB.

The inverter 20 may be made of SiC n-channel MOSFETs instead of IGBTs. The parallel-connected switches (i.e., the first and second switches SWA and SWB) of each of the upper and lower arms for each phase may be implemented by switches different in type from each other. For instance, the parallel-connected switches may be implemented by two IGBTs and a single MOSFET connected in parallel to each other.

The electrical power converter (i.e., the inverter 20 in the above embodiments) may be designed as a DC-DC converter which has at least one of a first feature to step-up an input voltage and output it and a second feature to step-down an input voltage and output it.

As apparent from the above discussion, the driver circuit 50 in the above embodiments is basically designed to drive a plurality of switches (i.e., the switches SWA and SWB) connected in parallel to each other. The driver circuit 50 includes a switch unit (61A, 61B, 71A, 71B, 75A, 75B, 101A, 101B) which works to turn on only a selected one(s) of the switches, individual electrical paths (LDA, LDB, LCA, LCB) each of which is connected at a first end to a gate of one of the switches, individual resistors (70A, 70B, 100A, 100B) each of which is arranged in one of the individual electrical paths, a shared electrical path (LDT, LCT) which is connected to second ends of the individual electrical paths which are opposite sides of the individual resistors than to the first ends connected to the gates of the switches, and a shared resistor (72, 102) which is mounted in the shared electrical path.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

What is claimed is:

1. A driver circuit for driving a plurality of switches connected in parallel to each other, the driver circuit comprising:
   a switch unit which works to turn on only a selected one or more of the switches;
   individual electrical paths, each of which is connected at a first end to a gate of one of the switches;
   individual resistors, each of which is arranged in one of the individual electrical paths; a shared electrical path which is connected to second ends of the individual electrical paths which are opposite sides of the individual resistors than to the first ends connected to the gates of the switches;
   a shared resistor which is mounted in the shared electrical path,
   wherein the individual electrical paths are provided as individual discharging paths,
   wherein the individual resistors are provided as individual discharge resistors,
   wherein the shared electrical path is provided as a shared discharge path which connects the second ends of the individual discharging paths which are on the opposite sides of the individual discharge resistors to the first ends connected to the gates and grounds to which charges at the gates are discharged,
   wherein a discharge switch is arranged in the shared discharge path, and
   wherein the switch unit includes charge switches, one for each of the switches, each of which connects the gate of a corresponding one of the switches and an electrical power source and blocking units, each of which is arranged in one of the individual discharging paths and permits a flow of electrical current in a first direction from the gate to the shared discharge path and blocks a flow of electrical current in a second direction opposite the first direction; and
   off-hold switches, one for each of the switches, each of which short-circuits between a portion of a corresponding one of the individual discharging paths which is closer to the gate than the blocking unit is and the ground.

2. The driver circuit as set forth in claim 1, further comprising;
   a selector which selects two or more of the switches as on-targets required to be turned on,
   wherein the selector works to turn on the off-hold switches for one or more of the on-targets other than one required to be last turned off and then turns off the discharge switch.

3. The driver circuit as set forth in claim 1,
   wherein the individual electrical paths are provided as individual charging paths, and the individual resistors are provided as individual charge resistors,
   wherein the shared electrical path is provided as a shared charge path which connects between a portion of each of the individual charging paths which is on an opposite side of a corresponding one of the individual charge resistors than to the gate and an electrical power source, and
   wherein the switch unit includes charge switches arranged in the individual charging paths.

4. The driver circuit as set forth in claim 1, further comprising:
   a selector which selects two or more of the switches as on-targets required to be turned on in a first current range, and in a second current range lower in current than the first current range, selects one or more of the switches smaller in number than the on-targets selected in the first current range as the on-targets required to be turned on,
   wherein when determining that a total current flowing through a parallel-connected switch set that is a combination of the switches connected in parallel to each other is lower than or equal to a reference value, the selector determines that the total current lies in the second current range, when determining that the total current is higher than the reference value, the selector determines that the total current lies in the first current range, and
   wherein when a voltage applied to a higher-potential one of ends of each of the switches is lower, the selector determines the reference value to be larger than that when the applied voltage is higher.

5. The driver circuit as set forth in claim 4, wherein a resistance value of each of the individual resistors and the shared resistor is determined so that a switching speed when a total current flowing through a parallel-connected switch set that is a combination of the switches connected in parallel to each other becomes a permissible upper limit is higher than that when the total current becomes the reference value.

6. The driver circuit as set forth in claim 1, further comprising:
   a selector which selects two or more of the switches as on-targets required to be turned on in a first current range and, in a second current range lower in current than the first current range, selects one or more of the switches smaller in number than the on-targets selected in the first current range as the on-targets required to be turned on,
   wherein when determining that a total current flowing through a parallel-connected switch set that is a combination of the switches connected in parallel to each other is lower than or equal to a reference value, the selector determines that the total current lies in the second current range, when determining that the total current is higher than the reference value, the selector determines that the total current lies in the first current range, and
   wherein the selector variably determines the reference value as a function of a temperature of the switches.

7. A driver circuit for driving a plurality of switches connected in parallel to each other, the driver circuit comprising:
   a switch unit which works to turn on only a selected one or more of the switches;
   individual electrical paths, each of which is connected at a first end to a gate of one of the switches;
   individual resistors, each of which is arranged in one of the individual electrical paths;
   a shared electrical path which is connected to second ends of the individual electrical paths which are opposite sides of the individual resistors than to the first ends connected to the gates of the switches; and
   a shared resistor which is mounted in the shared electrical path,
   wherein each of the individual resistors has a resistance value smaller than that of the shared resistor.

8. The driver circuit as set forth in claim 7,
wherein the individual electrical paths are provided as individual charging paths, and the individual resistors are provided as individual charge resistors,
wherein the shared electrical path is provided as a shared charge path which connects between a portion of each of the individual charging paths which is on an opposite side of a corresponding one of the individual charge resistors than to the gate and an electrical power source, and
wherein the switch unit includes charge switches arranged in the individual charging paths.

9. The driver circuit as set forth in claim 7, further comprising:
a selector which selects two or more of the switches as on-targets required to be turned on in a first current range, and in a second current range lower in current than the first current range, selects one or more of the switches smaller in number than the on-targets selected in the first current range as the on-targets required to be turned on,
wherein when determining that a total current flowing through a parallel-connected switch set that is a combination of the switches connected in parallel to each other is lower than or equal to a reference value, the selector determines that the total current lies in the second current range, when determining that the total current is higher than the reference value, the selector determines that the total current lies in the first current range, and
wherein when a voltage applied to a higher-potential one of ends of each of the switches is lower, the selector determines the reference value to be larger than that when the applied voltage is higher.

10. The driver circuit as set forth in claim 7, further comprising:
a selector which selects two or more of the switches as on-targets required to be turned on in a first current range and, in a second current range lower in current than the first current range, selects one or more of the switches smaller in number than the on-targets selected in the first current range as the on-targets required to be turned on,
wherein when determining that a total current flowing through a parallel-connected switch set that is a combination of the switches connected in parallel to each other is lower than or equal to a reference value, the selector determines that the total current lies in the second current range, when determining that the total current is higher than the reference value, the selector determines that the total current lies in the first current range, and
wherein the selector variably determines the reference value as a function of a temperature of the switches.

11. The driver circuit as set forth in claim 9, wherein a resistance value of each of the individual resistors and the shared resistor is determined so that a switching speed when a total current flowing through a parallel-connected switch set that is a combination of the switches connected in parallel to each other becomes a permissible upper limit is higher than that when the total current becomes the reference value.

* * * * *